(12) United States Patent
Torii

(10) Patent No.: US 7,079,423 B1
(45) Date of Patent: Jul. 18, 2006

(54) METHOD FOR PROGRAMMING DUAL BIT MEMORY DEVICES TO REDUCE COMPLEMENTARY BIT DISTURBANCE

(75) Inventor: Satoshi Torii, Sunnyvale, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 10/896,299

(22) Filed: Jul. 20, 2004

(51) Int. Cl.
*G11C 16/04* (2006.01)

(52) U.S. Cl. .......................... 365/185.28; 365/185.29; 365/185.22

(58) Field of Classification Search ..................... None
See application file for complete search history.

(56) References Cited

U.S. PATENT DOCUMENTS 6,590,811 B1 * 7/2003 Hamilton et al. ...... 365/185.22
6,934,190 B1 * 8/2005 Liu et al. ............... 365/185.19

* cited by examiner

*Primary Examiner*—David Lam

(57) ABSTRACT

The present invention provides a method for programming a selected bit in a memory cell of a non-volatile dual bit flash memory device. The method includes applying a positive voltage to a bit line associated with the selected bit and applying another positive voltage to a word line associated with the selected bit. Next, a positive voltage is applied to a second bit line associated with a complementary bit that shares the memory cell with the selected bit. A positive voltage is also applied to a third bit line that is adjacent to the second bit line and removed from the bit line associated with the selected bit by the second bit line. Applying a negative voltage to the word line then erases the complementary bit, but not its adjacent non-selected bit. The programming cycle is repeated until a desired threshold voltage is obtained.

18 Claims, 8 Drawing Sheets

METHOD FOR PROGRAMMING DUAL BIT MEMORY DEVICES TO REDUCE COMPLEMENTARY BIT DISTURBANCE

TECHNICAL FIELD

The present invention relates to the field of microelectronic integrated circuits. Specifically, the present invention relates to dual bit flash memory devices.

BACKGROUND ART

A flash or block erase memory (flash memory), such as, Electrically Erasable Programmable Read-Only Memory (Flash EEPROM), includes an array of cells, which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, and control gate to which various voltages are applied to program the cell with a binary 1 or 0, or erase all of the cells as a block. The flash memory cell provides for nonvolatile data storage.

A typical configuration of an array of flash memory cells includes rows and columns of flash memory cells. The array is supported by word lines and bit lines, wherein the word lines are coupled to gates of flash memory cells, and the bit lines are coupled to drains. The sources of the flash memory cells are commonly coupled together.

In a dual bit flash memory cell, the flash memory cell stores data by holding charge within an oxide-nitride-oxide (ONO) layer. The charge storage element within the ONO layer allows electrons to be stored on either side of the flash memory cell. As a result, the basic memory cell behaves as two independent conventional memory cells. In a write or programming operation, charge can be placed on the nitride layer through hot electron injection. In addition, hole injection can be typically used for erasing the flash memory cell through the neutralization of charge in the nitride.

A dual bit flash memory device contains two bits. The bit that is selected during a "read" operation has the bit line closest to it assigned as the source. To program the selected bit, a charge may be injected on the source side. The bit that is at the source side (selected) during a "read" operation is known as the "normal" bit. The bit that is at the drain side (not selected) during a read operation is referred to as the complementary bit. There are four states defined for a dual bit cell: a "11" state in which both bits are erased, or in which there is no charge in the cell; a "00" state in which both the bits are programmed; a "01" state in which one bit is programmed and one bit is erased and the selected bit is programmed; and a "10" state in which one bit is programmed and one bit is erased and the selected bit is erased.

Prior Art FIGS. 1A–1D are cross sectional diagrams illustrating the operation of non-volatile dual bit flash memory cells. These figures illustrate the programmed and erased states for a normal bit (the bit that is at the source side in a read operation) and a complementary bit (the bit that is at the drain side in a read operation) in a dual bit flash memory cell. Prior Art FIG. 1A illustrates a dual bit flash memory cell 100a in which a charge 110 is held in the source side 125 of ONO 115. This is a "01" state and represents a cell in which the normal bit is programmed. Channel 120 is blocked by charge 110 and current does not flow from the source side 125 to drain side 130. Whether the cell is programmed (channel blocked) or erased (channel not blocked and current flowing) is determined by the state of the normal bit. (Note that the bit to be read, the normal bit, is defined by the role of the bit line adjacent to it. The normal bit will be the bit adjacent to the source line. The complementary bit will be adjacent to the drain. The roles of the bit lines may change, in which case, in a given dual bit memory cell, either bit may function as a normal bit and, accordingly, as a complementary bit.)

Prior Art FIG. 1B represents a state "11" in which there is no charge present. Therefore both the normal bit (adjacent to source 125) and the complementary bit are erased and the channel 120 is formed, allowing current to flow from source 125 to drain 130.

Prior Art FIG. 1C represents state "10" in which the complementary bit holds charge 140 on the drain side of ONO 115. In this state the channel 120 is formed and current flows from source 125 to drain 130. This state is considered an erased state since there is no charge on the normal bit at the source side.

A failure in dual bit flash memory can result from a broadening of the charge 140 on the complementary bit. This broadening may occur as a result of over programming the complementary bit. This broadening effect results in a reduction of current in channel 120 that, in turn, increases the threshold voltage for state "10". There is a required window between the threshold voltage for a programmed state (normal bit charged) and an erased state (normal bit erased) which, if compromised, can result in a read failure. This read failure is due to the inability to distinguish between a "0" and a "1" because of the increase in threshold voltage due to the broadening of the charge 140 at a programmed complementary bit. This effect is known as "complementary bit disturbance".

Prior Art FIG. 1D represents state "00" in which both the bit holding charge 110 and the bit holding charge 140 are programmed. The channel 120 is blocked by charge 110 and no current flows.

Prior Art FIG. 2 is a graph 200 illustrating complementary bit disturbance in non-volatile dual bit flash memory cells. In graph 200, the two bits in the dual bit memory cell undergo cycling of programming and erasure. The cycling begins with the "11" state in which both bits are erased. Next, a first one of the bits is programmed until its threshold voltage (Vt) becomes higher than the target level of threshold voltage for programming. Then, Vt for each bit is measured. The relative Vt for the first programmed bit is represented by NB_PRG 210, showing the "01" state of the cell. The relative Vt for the second bit, which is still in an erased state, is represented by CB_PRG 230, showing the "10" state of the cell.

After the Vt is measured, the second bit is programmed until its Vt reaches the target level for programming and the cell obtains a "00" state (not represented on graph 200). Next, both bits are erased until their Vt falls below the target level for erasure and the Vt of each bit is again measured. NB_ERS 220 represents the relative Vt for the first programmed bit, and CB_ERS 240 represents the relative Vt for the second programmed bit. Since both bits are erased, both NB_ERS 220 and CB_ERS 240 are regarded as a "11" state of the cell. After erasure, the first bit is selected and programmed again as before and the process is repeated to generate multiple cycles of programming and erasure.

The charge on the complementary bit (the bit not being read) may broaden and reduce the current flow which, in turn, can cause an increase in the Vt causing complementary bit disturbance. This can be seen in the data points plotted for CB_PRG 230. The arrow 250 indicates the relative value of a design Vt window that is desirable for being able to distinguish between a programmed and an erased state. Arrow 260 indicates the relative value of the actual Vt window, which can be seen to be compromised by the complementary bit disturbance at CB_PRG 230.

SUMMARY OF THE INVENTION

Embodiments of the present invention provide a method for programming a selected bit in a memory cell of a non-volatile dual bit flash memory device. The method includes applying a positive voltage to a bit line associated with the selected bit and applying another positive voltage to a word line associated with the selected bit. Next, a positive voltage is applied to a second bit line associated with a complementary bit that shares the memory cell with the selected bit. A positive voltage is also applied to a third bit line that is adjacent to the second bit line and removed from the bit line associated with the selected bit by the second bit line. Applying a negative voltage to the word line then erases the complementary bit, but not its adjacent non-selected bit. The programming cycle is repeated until a desired threshold voltage is obtained.

BRIEF DESCRIPTION OF THE DRAWINGS

PRIOR ART

PRIOR ART

DETAILED DESCRIPTION OF THE INVENTION

Figure 1A:
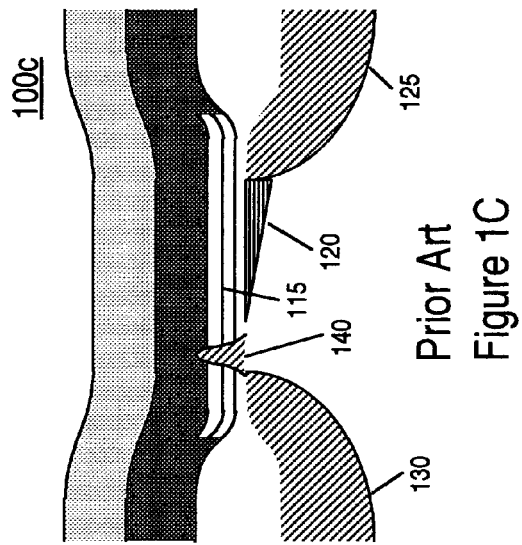
FIGS. 1A–1D are diagrams illustrating the operation of non-volatile dual bit flash memory cells.
Figure 1B:
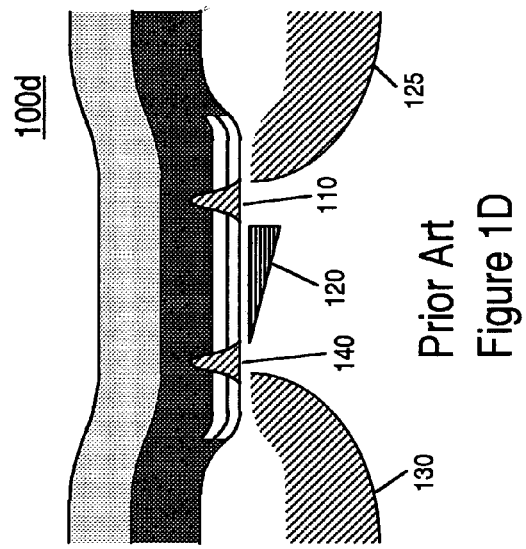
Figure 1C:
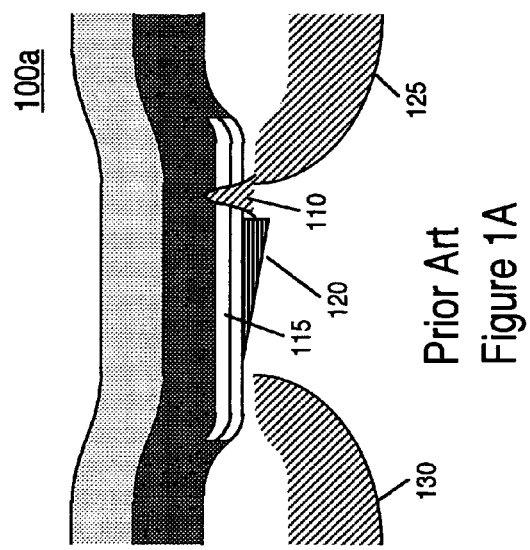
Figure 1D:
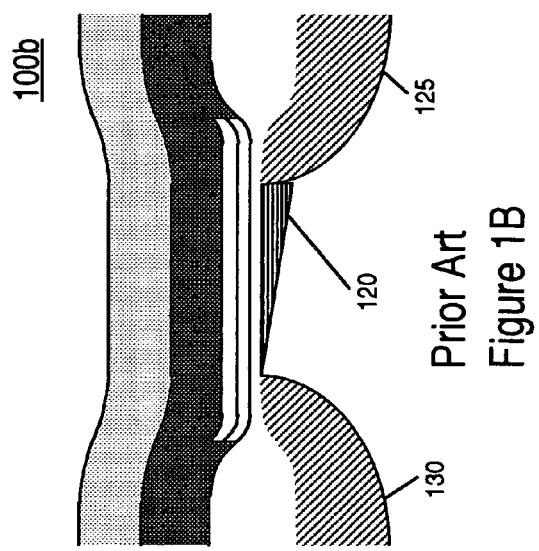

Reference will now be made in detail to embodiments of the present invention, a method for programming dual bit memory devices to reduce complementary bit disturbance. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method for programming memory cells by applying "counter erase" voltages to word lines and bit lines in an array of dual bit memory cells to assure that the complementary bits of the memory cells are erased when the normal bits are programmed to be read. As a result, embodiments of the present invention are more reliable than conventional programming processes of arrays of dual bit memory cells in that complementary bit disturbance resulting from cycle aging or other environmental effects is reduced. Complementary bit disturbance causes a reduction in the current for an erased bit when its complementary bit is programmed, thereby increasing the threshold voltage. Specifically, embodiments of the present invention significantly reduce the effects of complementary bit disturbance in non-volatile dual bit flash memory cells.

In a dual bit flash memory cell, the cell layout typically has a source and drain that are connected in parallel. The sources and drains of a plurality of memory cells are connected in parallel to form columns, wherein a column is defined as a bit line. The bit line is connected to a sense amplifier via a selection gate. The gates of the adjacent memory cells are coupled in the column direction with a single wire and this coupling of gates forms a word line. Operations of the non-volatile semiconductor memory of dual bit type memory cells are as follows:

Data Write Operation

A data write operation is performed by applying the positive voltage (e.g., 5V) to the bit line connected to the drain of a selected cell, giving 0V to the bit line connected to the source and applying another positive voltage (e.g., 9V) to the word line. In this case, the bit line and the word line of non-selected cells are floated to avoid data writing. When the data write operation is performed, hot electrons are generated near the drain in the selected cell. The hot electrons are trapped into a nitride film near the drain, overcoming the barrier of the first gate oxide film. Thereby, a threshold voltage of the selected cell shifts in the positive direction.

Data Erase Operation

A data erase operation is performed for all memory cells of a selected block by applying negative voltage (e.g., −6V) to all word lines of the selected block and setting all bit lines to a positive voltage (e.g., 5V). Electrons trapped in the nitride film are removed and the threshold voltage is shifted in the negative direction.

Data Read Operation

Data read is determined with the absolute value of a current flowing into the selected memory cell. The data read operation is performed by applying a positive voltage (e.g., 3V) to the word line connected to the selected memory cell, applying another positive voltage (e.g., 1.4V) to the bit line connected to the drain and giving 0V to the bit line connected to the source. However, the relationship between the drain and source during the read operation is inverted from the relationship in the data write operation, because electrons are trapped at the area near the diffused layer defined as the drain at the time of data write operation. Namely, a larger shift of threshold value can be obtained when the electrons are trapped at the source side.

Alternatively, if electrons are trapped only at the drain at the time of the read, the threshold value hardly shifts from the value before trapping. A dual bit flash memory utilizes this phenomenon to store two bits in one cell.

Data Verify

Data verify follows a program or erase operation to see that bits are sufficiently programmed or erased. Data verify is performed with the same voltage conditions as data read except that the word line voltage given to the cell being verified.

In program verify, the voltage for the word line (e.g., 4V) is higher than that for data read. The current flowing thorough a cell being verified is compared to a reference current. If the cell current is smaller than the reference current, the cell is regarded as being programmed and the program operation will not be performed again. However, if the cell current is greater than the reference current, the cell is recognized as not being sufficiently programmed and performed and the program operation is performed again.

In erase verify, the voltage for the word line (e.g., 2V) is lower than that for data read. The current flowing thorough a cell being verified is compared to a reference current. If the cell current is greater than the reference current, the cell is regarded as being erased and the erase operation will not be performed again. However, if the cell current is lower than the reference current, the cell is recognized as not being sufficiently erased and the erase operation is performed again.

Figure 3:
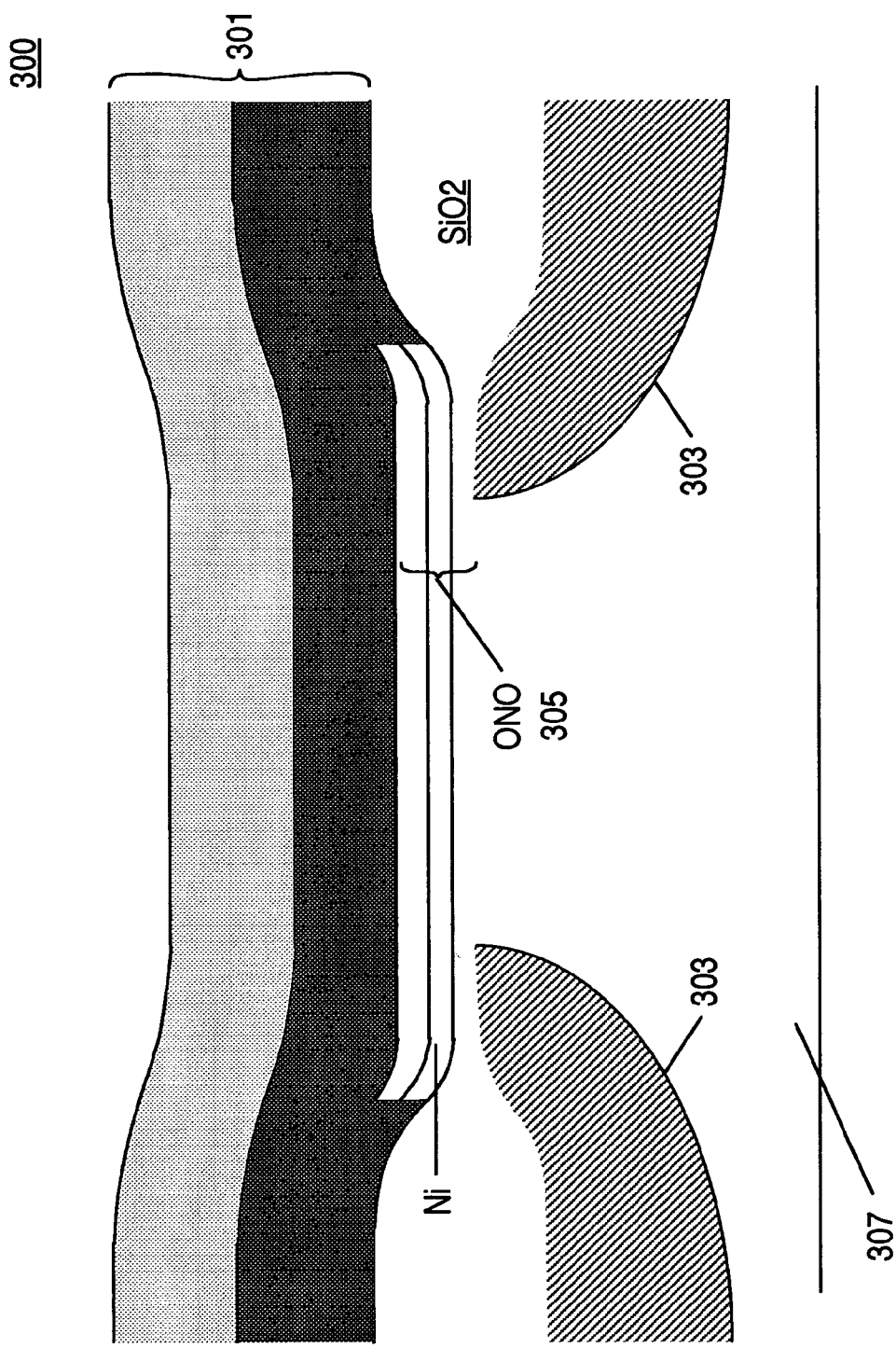
FIG. 3 is a typical configuration of a dual bit flash memory cell, for implementation within an array of memory cells, in accordance with one embodiment of the present invention.

Referring now to FIG. 3, a typical configuration of a dual bit memory cell 300, that is a flash memory cell, for implementation within an array of memory cells is shown, in accordance with one embodiment of the present invention. The dual bit memory cell 300 consists of an oxide-nitride-oxide (ONO) layer 305, within which the storage element is contained. That is, charge is stored within the ONO layer 305 on either side of the dual bit memory cell 300. The ONO layer 305 is sandwiched between a control gate 301 and a crystalline silicon semiconductor substrate 307. The substrate 307 includes selectable source/drain regions 303.

The dual bit memory cell comprises two distinct storage areas for programming and erasing. That is, the dual bit memory cell 300 can store one bit on the left side of the cell 300 and separately store another bit on the right side of the dual bit memory cell 300. Once electrons are placed into one side of the storage element, say on the left side of the cell, they remain trapped on that side. Similarly, once electrons are placed into the right side of the cell, they remain trapped to the right side. As a result the basic dual bit memory cell 300 behaves as though it were two independent conventional memory cells. This architecture therefore offers twice the density of standard memory cells without sacrificing performance or reliability.

Figure 4:
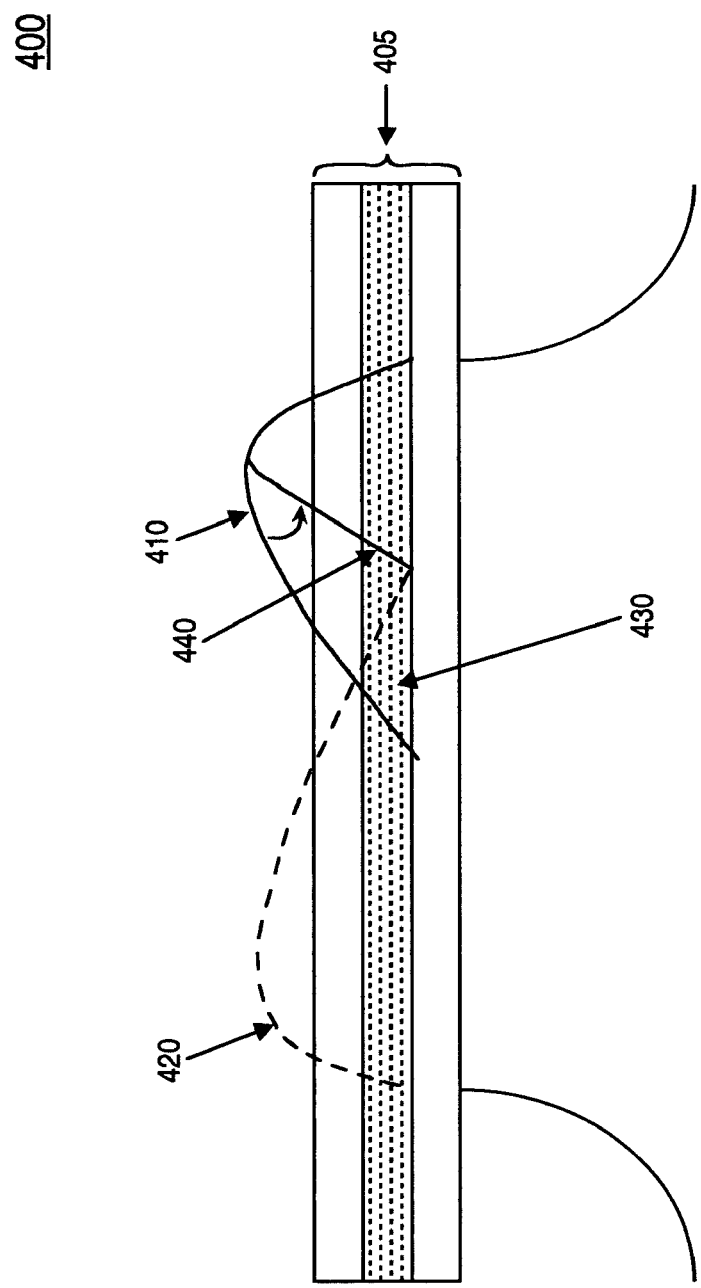
FIG. 4 is a diagram of the cross-section of a dual bit flash memory cell illustrating a counter erase pulse 420 effect on the stacked ONO, in accordance with one embodiment of the present invention.

FIG. 4 is a diagram of the cross-section of a dual bit flash memory cell 400 illustrating a counter erase pulse effect on the stacked gate 405, in accordance with one embodiment of the present invention. Complementary bit (CB) disturbance may be caused by the broadening distribution of a charge on the CB. This charge may be the result of over-programming the one bit that shares the cell with the other bit that is in an erased state. This CB disturbance may lead to a reduction in current that, in turn, may increase the threshold voltage for the erased bit. An embodiment of the present invention reduces the complementary bit disturbance following the programming of a dual bit cell.

According to one embodiment of the present invention, solid line 410 represents the distribution of electrons resulting from a programming pulse at the one bit of memory cell 400 which has to be programmed. Dotted line 420 represents the distribution of holes resulting from a counter-erase pulse at the other bit of cell 400 which is to retain an erased state. Region 430 in which the injection of electrons 410 and injection of holes 430 overlap represents a region that becomes neutralized. As a result, the distribution of electrons becomes narrower, as shown by the shifted solid line 440. This helps to suppress over-programming of the cell, especially in a cell having a short channel.

Figure 5:
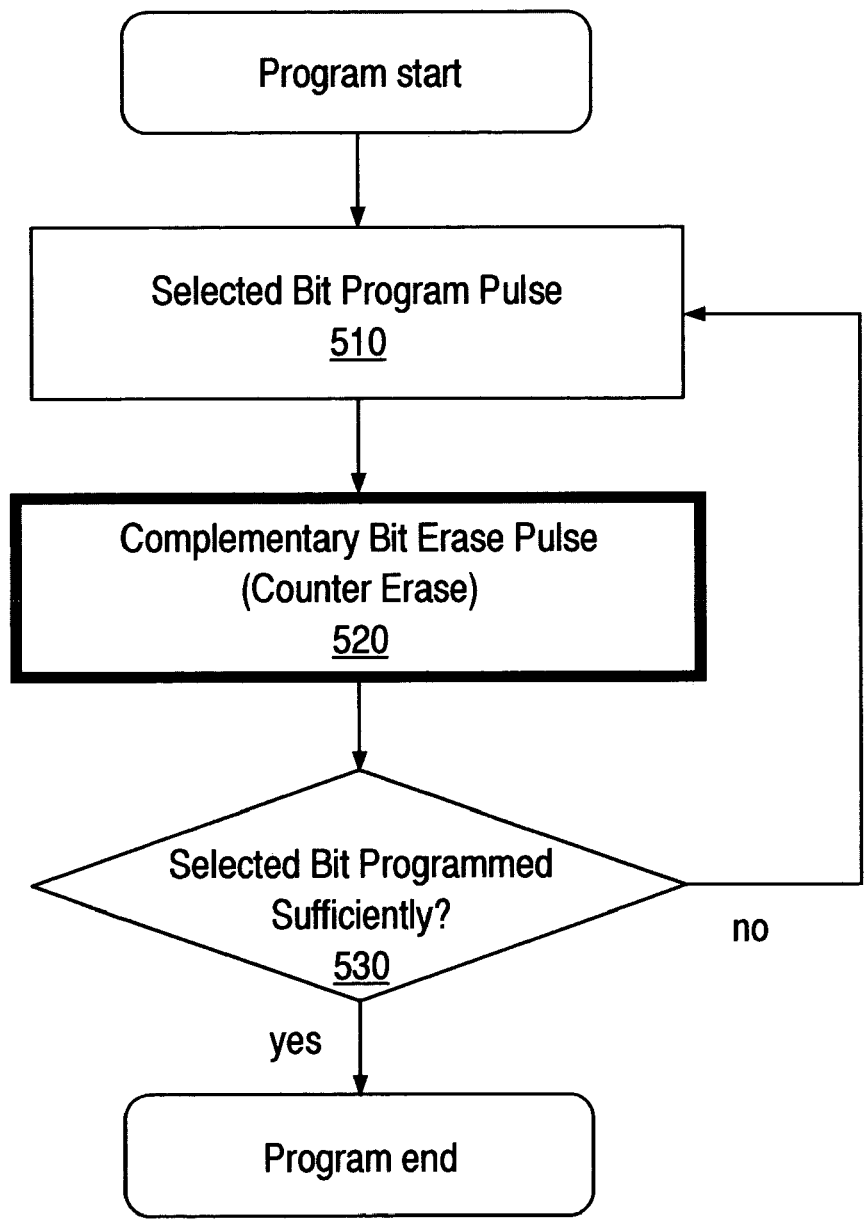
FIG. 5 is a flow chart illustrating an overview of a method for programming memory cells to reduce complementary bit disturbance, in accordance with one embodiment of the present invention.

Referring now to FIG. 5, a flow chart is presented. The flow chart illustrates an overview of a method 500 for programming memory cells to reduce complementary bit disturbance, in accordance with one embodiment of the present invention. At step 510, a first phase of the programming cycle begins as a selected bit receives a program pulse.

At step 520 of method 500, according to an embodiment of the present invention, the second phase of the programming cycle begins when a counter erase pulse follows the programming of the selected bit. The counter erase pulse is applied to its complementary bit in the same dual bit memory cell that contains the selected bit. This counter erase pulse injects holes at the complementary bit side of the cell (e.g., as shown by dotted line 420 of FIG. 4).

At step 530, the third phase of the programming cycle, according to one embodiment, consists of the performance of a verification to determine if the selected bit is programmed sufficiently. That is, the verification checks whether the threshold voltage of the selected bit equals a required threshold voltage. If the threshold voltage meets the requirements, then the selected bit is considered programmed sufficiently. If the selected bit is not programmed sufficiently, the process begins again at step 510 and repeats until the required voltage is obtained.

Figure 6:
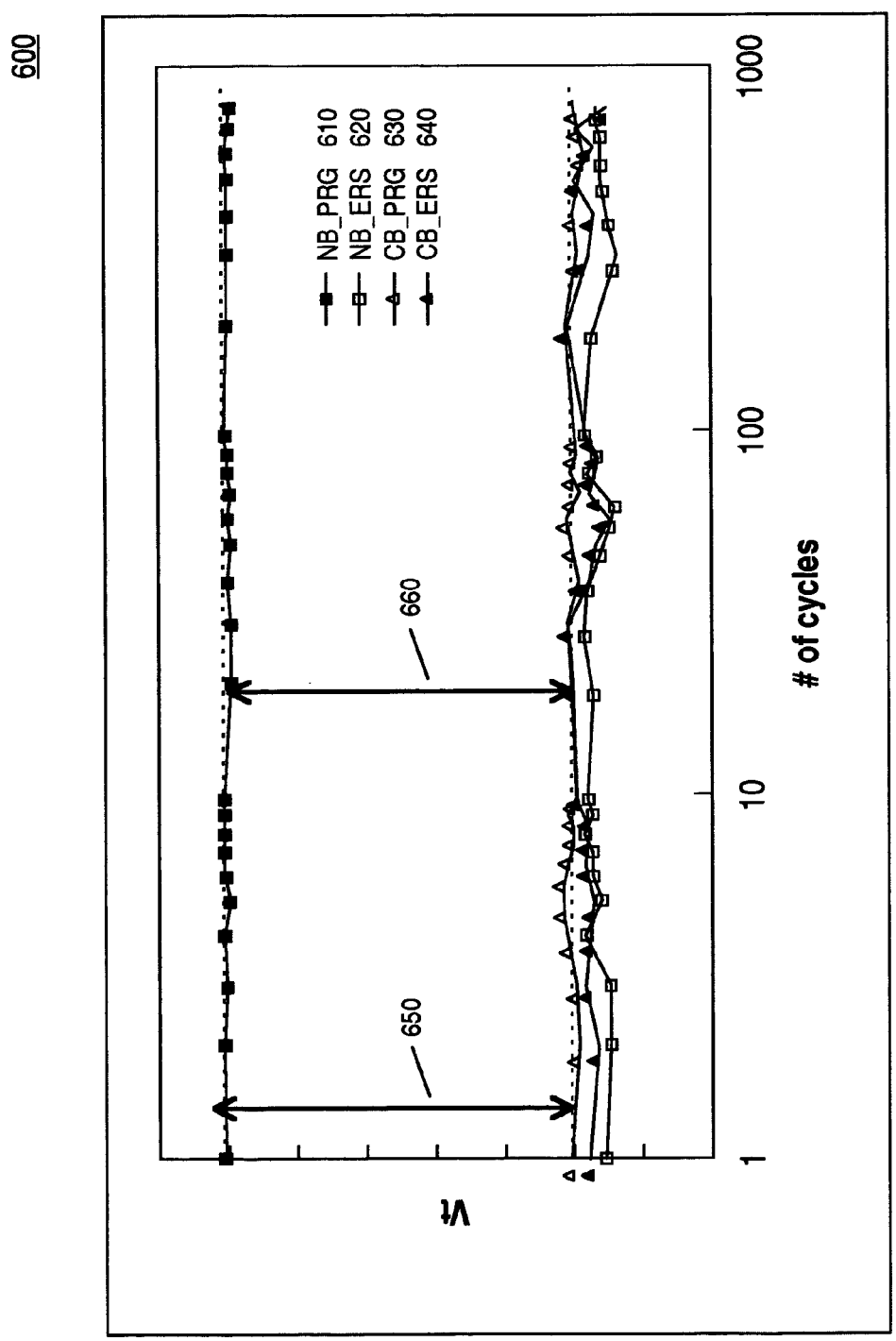
FIG. 6 is a graph illustrating the reduction of complementary bit disturbance in non-volatile dual bit flash memory, in accordance with one embodiment of the present invention.

FIG. 6 is a graph 600 illustrating the reduction of complementary bit disturbance in non-volatile dual bit flash memory, in accordance with one embodiment of the present invention. Graph 600 represents the threshold voltage (Vt) taken following an erase sequence that has been followed by a sequence to program the normal bit over an increasing number of program/erase cycles. The programming of the normal bit follows a process in which the selected normal bit receives a program pulse, the program pulse is then followed by a counter erase pulse to eliminate any over-programming of the complementary bit that might lead to complementary bit disturbance, after which the programming is verified and, if the programming is sufficient, the process is complete. If the programming is deemed insufficient, the process is repeated until it is programmed sufficiently.

NB_ERS 620 represents the relative Vt of the first bit following the erase cycle in which the first bit and the second bit are erased and represents the "11" state. CB_ERS 640 represents the relative Vt of the second bit following the erase cycle in which the first bit and the second bit are erased and the state is also "11". NB_PRG 610 represents the relative Vt of the first bit following programming of the first bit and the cell is at a "01" state. CB_PRG 630 represents the relative Vt of the second bit following the programming of the first bit and the cell is at a "10" state.

Figure 2:
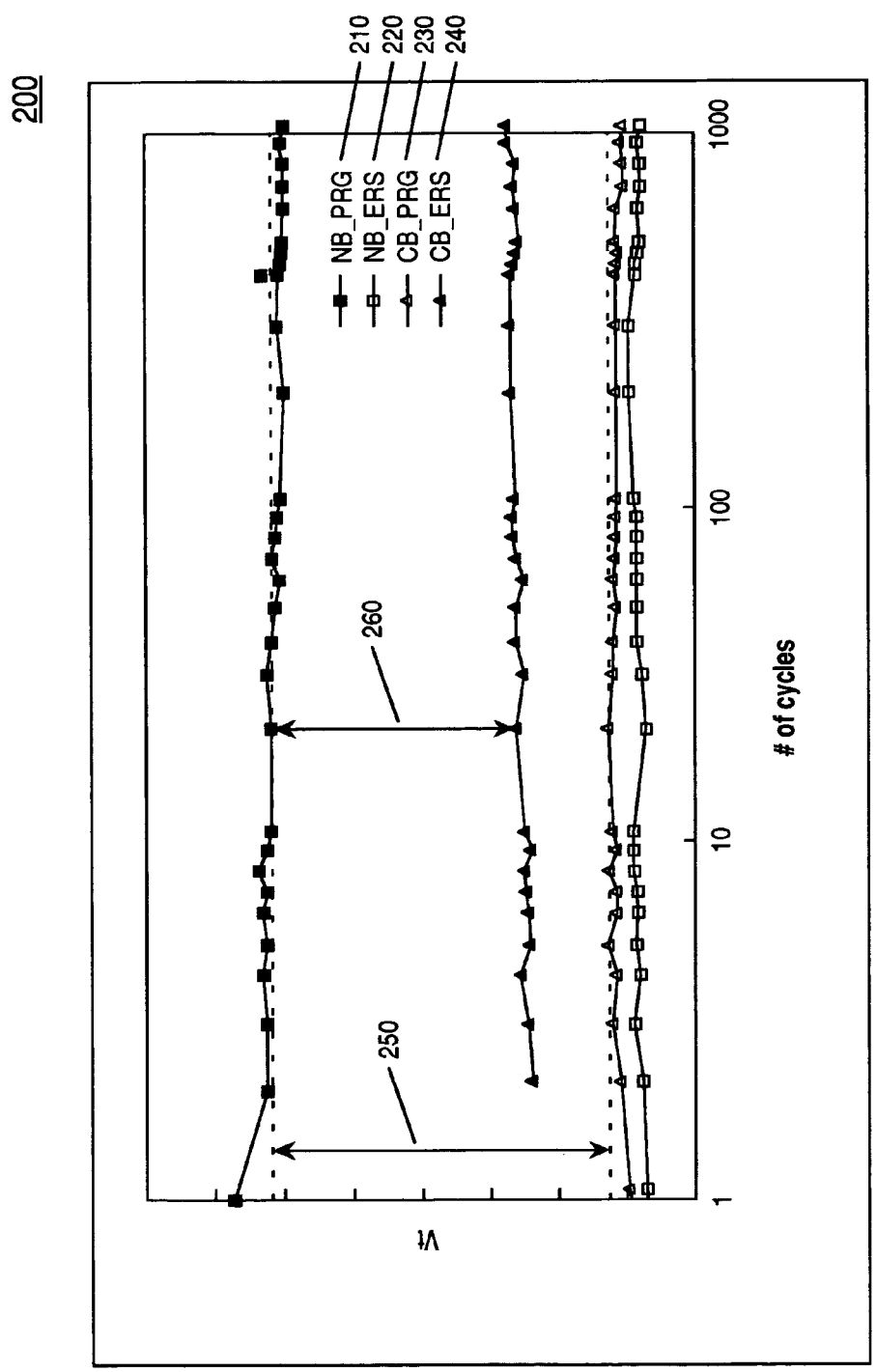
FIG. 2 is a graph illustrating complementary bit disturbance in non-volatile dual bit flash memory cells.

Contrasting FIG. 6 with Prior Art FIG. 2, it can be seen that the data points plotted for CB_PRG 630 are very close to the other erased state data points 620 and 640 where in Prior Art FIG. 2, the data points for CB_PRG 230 were removed from erased data points 220 and 240, indicating complementary bit disturbance. The arrow 650 of FIG. 6 indicates the relative value of design Vt window that is desirable for being able to distinguish between a programmed and an erased state, according to one embodiment. Arrow 660 indicates the relative value of the actual Vt window, which can be seen to be almost the same as the design window. Thus the data plotted in graph 600 indicates an improvement achieved by following a program pulse with a counter erase pulse when programming a dual bit flash memory device.

Figure 7:
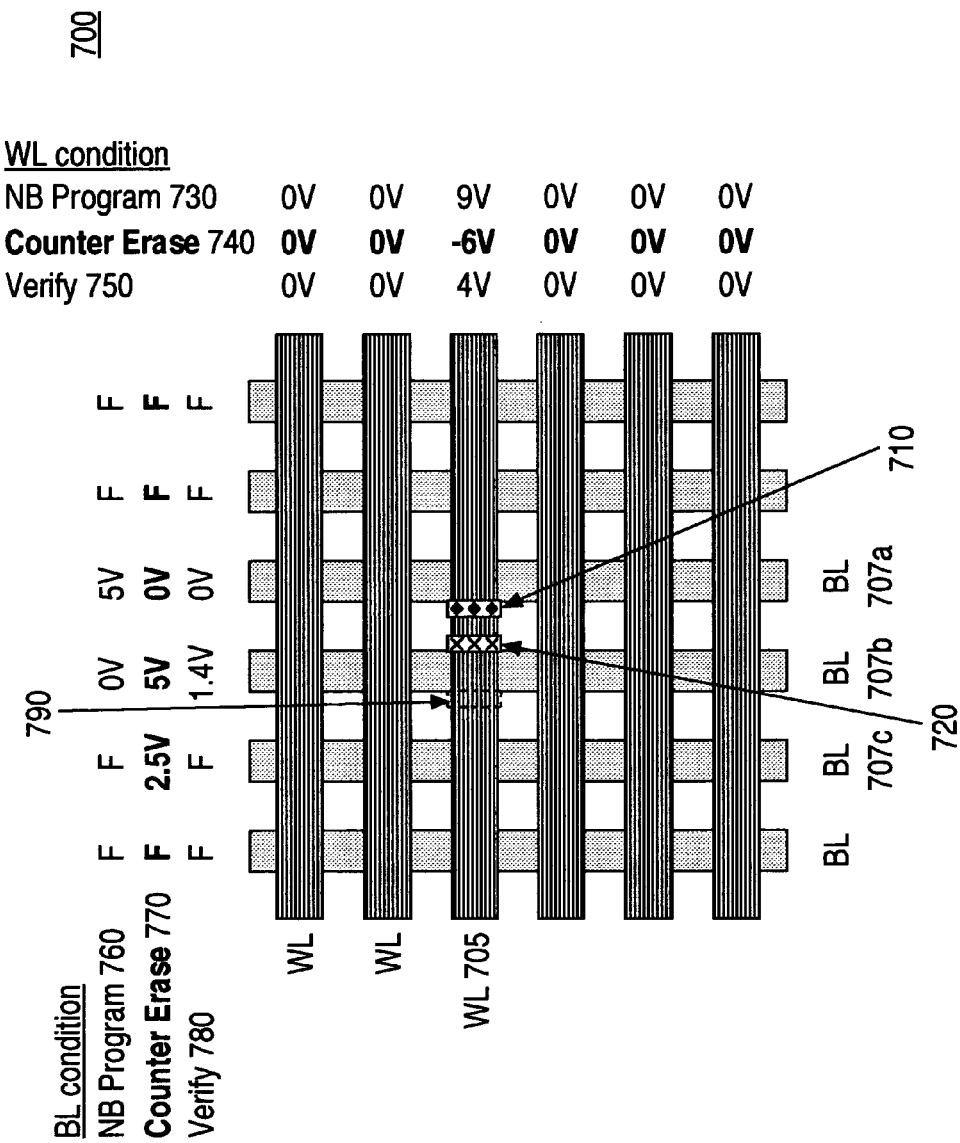
FIG. 7 is a surface diagram of an array of nonvolatile dual bit flash memory cells, in accordance with one embodiment of the present invention.

FIG. 7 is a surface diagram of an array 700 of nonvolatile dual bit flash memory cells, in accordance with one embodiment of the present invention. The array is suitable for performing a method for programming dual bit flash memory cells by applying alternating positive and negative voltages to word lines in the array 700. The method reduces complementary bit disturbance in memory cells in the array 700.

The array 700 comprises a plurality of word lines that form the control gates to the non-volatile memory cells. The word lines are arranged on the surface of the array 700 in a substantially parallel formation. The word lines are identical in formation. Word line 705 will be the referenced word line for the purposes of the present discussion.

According to one embodiment of the present invention, bit lines 707a, 707b and 707c form the source/drain regions for respective dual bit memory cells. Stack regions such as reside between selected bit 710 and its complementary bit 720 define individual dual bit flash memory cells serviced by adjacent source/drain regions located on either side of the stack regions in the substrate, and are comprised of an ONO layer and control gate layer. Typically normal bit 710 resides on the source side and complementary bit 720 resides on the drain side of the stack region. The word lines, e.g., word line 705, are electrically coupled to the control gate layers.

Figure 8:
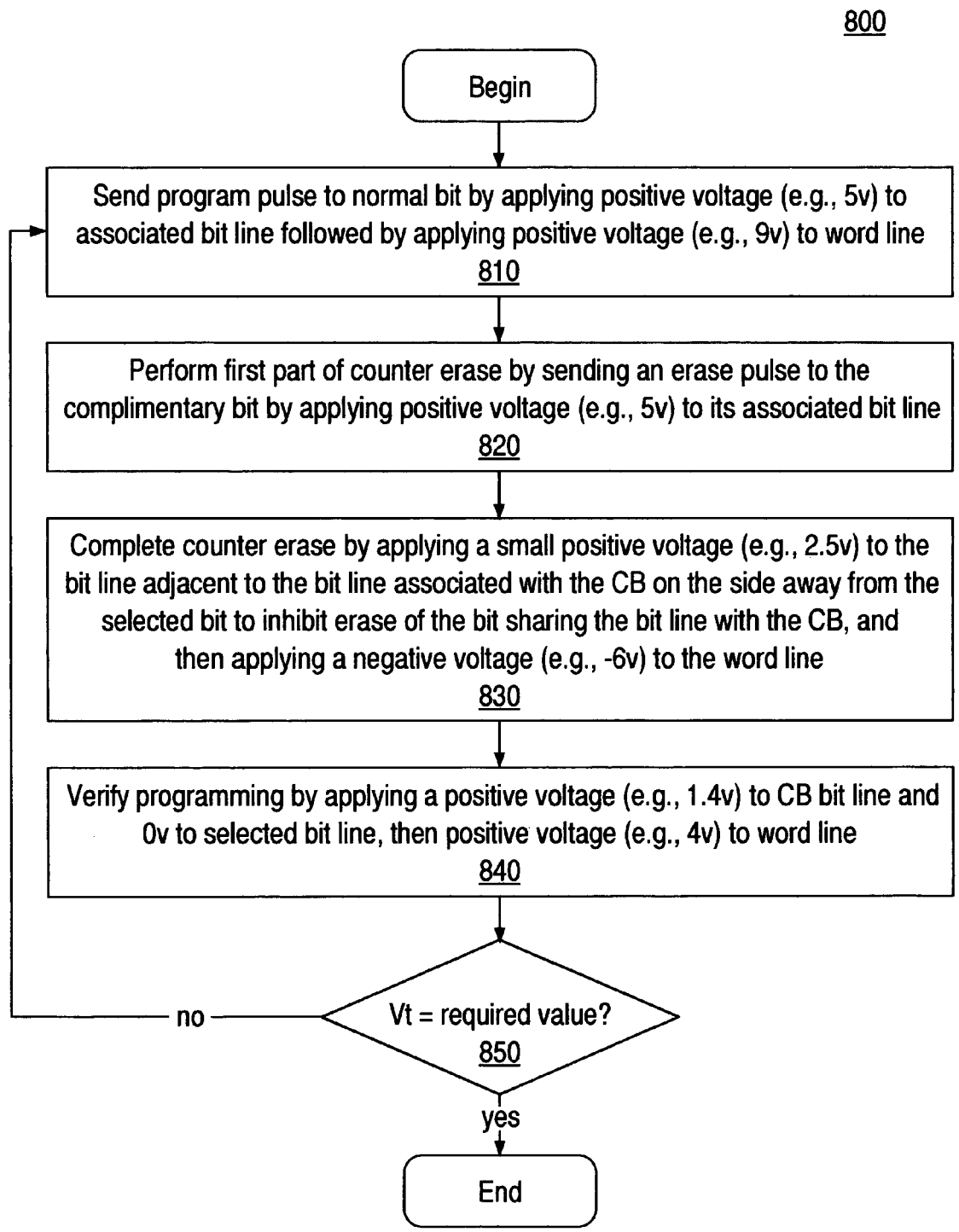
FIG. 8 is a flow chart illustrating the detailed steps in a method for programming dual bit flash memory cells to reduce complementary bit disturbance, in accordance with one embodiment of the present invention.

FIG. 8, in concert with FIG. 7, discloses a method for programming an array of dual bit flash memory cells and depictions of memory cells that are undergoing the program cycle in the method. FIG. 8 is a flow chart illustrating the detailed steps in a process 800 for programming dual bit flash memory cells to reduce complementary bit disturbance, in accordance with one embodiment of the present invention. Values of voltages that are used in the following discussion are exemplary only. It should be understood that there are numerous variations of voltages that may be applied for varying designs of dual bit flash memory devices. The state of the voltage, that is, whether it is positive or negative, is relevant, however.

Process 800 may be considered as comprising three distinct phases; a program phase, a counter erase phase, and a verify phase. All cells in a selected block have been erased to be in a "11" state prior to a data write operation. At step 810 of process 800, according to one embodiment of the present invention, the first phase, programming of a selected bit, begins when a program pulse is sent to the selected bit (e.g., 710 of FIG. 7) by applying a positive voltage, e.g., 5V, to associated bit line 707a (NB Program 760 of FIG. 7). The applying of the positive voltage to bit line 707a is followed by applying a positive voltage (e.g., 9V) to word line 705 (NB Program 730 of FIG. 7). Although voltages, e.g., 5V and 9V are given as examples, it should be understood that they are exemplary and should not be construed as limiting. It should also be understood that for any values of voltages used herein as examples a range is implied. For example, a voltage of 9V would be approximate and may fall within a range such as 8.5V–9.5V.

In accordance with one embodiment, the second phase, counter erase, has two steps. At step 820 of process 800, the first step of the counter erase comprises sending an erase pulse to complementary bit 720 by first applying a positive voltage, e.g., 5V, to its associated bit line 707b (Counter Erase 770).

At step 830 of process 800, the counter erase phase is completed, in accordance with one embodiment. This is accomplished by applying a small positive voltage, approximately one half the value of the voltage applied to bit line 707b (e.g., 2.5V), to bit line 707c (Counter Erase 770). This is to inhibit erasure of bit 790 that shares bit line 707b with complementary bit 720. Then, to complete the counter erase phase, a negative voltage, e.g., –6V, is applied to word line 705.

At step 840, the third phase of process 800 comprises verifying the programming of bit 710 by applying a small positive voltage, e.g., 1.4V, to the complementary bit's bit line 707b and 0V to bit line 707a (Verify 780). Then we apply a positive voltage, e.g., 4V, to word line 705.

At step 850, if the read current has reached a reference level (e.g., 10 micro amps), then the selected (normal) bit is regarded as programmed and process 800 is exited. If the read current has been above the reference level, then the programming is considered insufficient and process 800 is repeated until the read current falls below the reference level.

The preferred embodiment of the present invention, a method for programming dual bit memory devices to reduce complementary bit disturbance, is thus described. While the present invention has been described in particular embodiments, it should be appreciated that the present invention should not be construed as limited by such embodiments, but rather construed according to the below claims.

What is claimed is:

1. A method for programming a selected bit in a memory cell of a non-volatile dual bit flash memory device comprising:

pulsing said selected bit, and wherein said pulsing comprises:
applying a first positive voltage to a first bit line associated with said selected bit; and
applying a second positive voltage to a word line associated with said selected bit;

performing a counter erase on a complementary bit, wherein said performing a counter erase further comprises:
applying a third positive voltage to a second bit line associated with a complementary bit that shares said memory cell with said selected bit;
applying a fourth positive voltage to a third bit line, adjacent to said second bit line and separated from said first bit line by said second bit line, said fourth positive voltage for preventing erasure of a non-selected bit in an adjacent memory cell, and said non-selected bit sharing said second bit line with said complementary bit; and erasing said complementary bit by applying a negative voltage to said word line;
verifying that said selected bit is sufficiently programmed, wherein said verifying further comprises:
applying fifth positive voltage to said second bit line;
applying a sixth positive voltage to said word line; and
repeating said programming until the read current of said verifying reaches a value less than a reference level value.

2. The method as recited in claim 1, wherein said memory cell resides in an array of memory cells, each said memory cell comprising a normal bit and a complementary bit.

3. The method as recited in claim 2, wherein said selected bit comprises said normal bit.

4. The method as recited in claim 3 wherein said counter-erase operation reduces complementary bit disturbance.

5. In a dual bit memory device comprising at least one non-volatile memory cell, a method for programming said non-volatile memory cell, comprising:
applying a first positive voltage to a first bit line associated with a selected bit in a first phase of a programming cycle;
applying a second positive voltage to a word line associated with said selected bit in said first phase of said programming cycle;
applying a third positive voltage to a second bit line associated with a complementary bit that shares said memory cell with said selected bit in a second phase of said programming cycle;
applying, in said second phase of said programming cycle, a fourth positive voltage to a third bit line that is adjacent to said second bit line and separated from said first bit line by said second bit line, said fourth positive voltage for preventing erasure of a non-selected bit in an adjacent memory cell, said non-selected bit sharing said second bit line with said complementary bit;
erasing said complementary bit by applying a negative voltage to said word line in said second phase of said programming cycle;
applying fifth positive voltage to said second bit line in a third phase of said programming cycle;
applying a sixth positive voltage to said word line in said third phase; and
repeating said programming cycle said sixth positive voltage reaches a threshold voltage.

6. The method as recited in claim 5 wherein said first phase of said programming cycle comprises programming said selected bit.

7. The method as recited in claim 5 wherein said second phase of said programming cycle comprises a counter-erase operation.

8. The method as recited in claim 7 wherein said counter-erase operation is for reducing complementary bit disturbance.

9. The method as recited in claim 5 wherein said third phase of said programming cycle comprises verifying that said sixth positive voltage equals a threshold voltage defined as a programmed level.

10. The method as recited in claim 5, wherein said fourth positive voltage has a value that comprises one-half the value of said third positive voltage.

11. The method as recited in claim 5, wherein said memory cell resides in an array of memory cells, each comprising a normal bit and a complementary bit.

12. The method as recited in claim 11, wherein said selected bit comprises said normal bit.

13. A method for programming a first bit in a memory cell of a dual bit flash memory device, said memory cell comprising said first bit and a second bit, comprising:
applying a first positive voltage to a first bit line associated with said first bit in a first phase of a programming cycle;
applying a second positive voltage to a word line associated with said first bit in said first phase of said programming cycle;
applying a third positive voltage to a second bit line associated with said second bit that shares said memory cell with said first bit in a second phase of said programming cycle;
applying, in said second phase of said programming cycle, a fourth positive voltage to a third bit line that is adjacent to said second bit line and separated from said first bit line by said second bit line, said fourth positive voltage for preventing erasure of a non-selected bit in an adjacent memory cell, said non-selected bit sharing said second bit line with said second bit; and
erasing said second bit by applying a negative voltage to said word line in said second phase of said programming cycle.

14. The method as recited in claim 13 further comprising:
applying fifth positive voltage to said second bit line in a third phase of said programming cycle;
applying a sixth positive voltage to said word line in said third phase; and
repeating said programming cycle until a read current of said first bit is less than a reference current.

15. The method as recited in claim 13 wherein said second phase of said programming cycle comprises a counter-erase operation.

16. The method as recited in claim 15 wherein said counter-erase operation reduces complementary bit disturbance.

17. The method as recited in claim 12 wherein said third phase of said programming cycle comprises verifying that said sixth positive voltage equals a threshold voltage defined as a programmed level.

18. The method as recited in claim 13, wherein said fourth positive voltage has a value that comprises one-half the value of said third positive voltage.

* * * * *